(12) United States Patent
Song et al.

(10) Patent No.: US 6,465,085 B1
(45) Date of Patent: Oct. 15, 2002

(54) THIN FILM WIRING BOARD AND METHOD FOR MANUFACTURING THE SAME, BASE SUBSTRATE AND METHOD FOR MANUFACTURING THE SAME

(75) Inventors: Zhiyi Song; Kiyokazu Moriizumi; Takami Sasahara; Norikazu Ozaki; Manabu Watanabe; Misao Umematsu; Shunichi Kikuchi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/699,569

(22) Filed: Oct. 31, 2000

(30) Foreign Application Priority Data

Apr. 4, 2000 (JP) ........................................ 2000-102589
Apr. 18, 2000 (JP) ........................................ 2000-116988

(51) Int. Cl.⁷ ................................................ B32B 3/00
(52) U.S. Cl. ...................... 428/210; 428/209; 174/257; 174/261; 174/264
(58) Field of Search ................................. 428/209, 210; 174/261, 257, 259, 264

(56) References Cited

U.S. PATENT DOCUMENTS

| | | | |
|---|---|---|---|
| 5,093,186 A | * 3/1992 | Kimura et al. .............. | 428/209 |
| 5,118,385 A | 6/1992 | Kumar et al. | |
| 5,139,851 A | * 8/1992 | Acocella et al. ............. | 428/209 |
| 5,496,971 A | * 3/1996 | Moriizumi et al. ......... | 174/255 |
| 5,576,518 A | * 11/1996 | Shibuya et al. ............. | 174/264 |
| 5,586,006 A | * 12/1996 | Seyama et al. ............. | 174/255 |
| 5,688,606 A | * 11/1997 | Mahulikar et al. .......... | 428/615 |
| 5,985,461 A | * 11/1999 | Tani et al. .................. | 428/433 |
| 6,303,877 B2 | * 10/2001 | Moriizumi et al. ......... | 174/261 |

FOREIGN PATENT DOCUMENTS

| | | |
|---|---|---|
| JP | 05-275565 | 10/1993 |
| JP | 09-312471 | 12/1997 |

* cited by examiner

*Primary Examiner*—Cathy Lam
(74) *Attorney, Agent, or Firm*—Armstrong, Westerman & Hattori, LLP

(57) ABSTRACT

A dummy pad is formed through a polyimide insulating layer so as to be provided opposite to a via connecting pad formed on the surface of a ceramic substrate. A defect occurring in the via connecting pad is filled with a protrusion when the dummy pad is formed. Accordingly, the influence of the defect upon a layer above the dummy pad is prevented. Further, in a method for manufacturing a thin film wiring board obtained by forming a thin film layer on a base substrate having a via that allows interlayer electric conduction, a void defect existing in the via is filled with a conductive material having corrosion resistance against an etchant, and then the thin film layer is formed on the base substrate.

20 Claims, 13 Drawing Sheets

FORMATION OF A METAL LAYER BY SPUTTERING

FORMATION OF RESIST

COPPER PLATING

FORMATION OF RESIST

COPPER PLATING

REMOVAL OF RESIST

METAL ETCHING

POLYIMID COATING

TUNGSTEN SPUTTERING

CMP PROCESSING

TUNGSTEN ETCHING

THIN FILM WIRING BOARD AND METHOD FOR MANUFACTURING THE SAME, BASE SUBSTRATE AND METHOD FOR MANUFACTURING THE SAME

FIELD OF THE INVENTION

The present invention relates to a thin film wiring board with a via used for interlayer connection. More particularly, this invention relates to the thin film wiring board that allows manufacturing yield to be improved and a method for manufacturing the thin film wiring board. Further, this invention relates to a method for correcting a void defect occurring on the surface of a base substrate used for the thin film wiring board.

BACKGROUND OF THE INVENTION

In recent years, a multilayer thin film wiring board that enables high density wiring on an MCM (Multi Chip Module) board or the like has been in the actual use, and applied in electronic equipment such as a computer. This multilayer thin film wiring board is provided by laminating an insulating layer and a wiring layer. The insulating layer is generally made of polyimide and formed to be extremely thin by spin-coating. A high-density pattern is also formed on the wiring layer by using sputtering and a highly sensitive resist.

This multilayer thin film wiring board has a structure that allows the wiring and the power supply between electronic components by connecting LSI (Large Scale Integrated Circuit) packed on the surface of the board and terminals (signal terminal, power terminal, and ground terminal) of the electronic components such as input/output pins to a desired layer through vias.

In recent years, the multilayer thin film wiring board is also becoming denser in association with tighter packing of LSIs. Accordingly, at present, surface defects may easily be generated in the manufacturing process of the multilayer thin film wiring board, and reduction in the yield becomes an issue that should be taken care of. An effective solution to this problem is eagerly expected.

FIG. 10 and FIG. 11 show general views of the MCM. As shown in FIG. 10, a plurality of LSI chips 69 are mounted on the thin film wiring board 68, and cooling fins 71 for cooling are mounted above the chips. The input/output pins 70 for connection with a mother board not shown are provided in the opposite side to the cooling fins 70 with the LSI chip 69 in between.

The thin film wiring board 68 is structured with a thin film layer 74 formed on a ceramic substrate 72 as shown in FIG. 11, and a connection between the thin film wiring board 68 and the LSI chip not shown is made by a soldering bump 75. The diameter of a via 73 provided in the ceramic substrate 72 is around 0.1 mm to 0.2 mm.

FIG. 12A to FIG. 12E show cross-sectional views of the structure and the manufacturing process of a conventional multilayer thin film wiring board. FIG. 12A shows a ceramic substrate 1 having vias 2a and 2b. This ceramic substrate 1 is obtained by sintering a laminated thin-film ceramic sheet, and the surface 1c of this ceramic substrate 1 is flattened. A surface defect 3a occurs due to the difference between the hardness of the ceramic substrate 1 and that of the via 2b. Further, the surface 1c of the ceramic substrate 1 is supposed to have irregularities due to a phenomenon that ceramic particles are detached or a phenomenon that voids occurring at the time of sintering the ceramic substrate 1 are exposed.

In the manufacturing process using the ceramic substrate 1 shown in FIG. 12A, a via connecting pad 4a and a via connecting pad 4b are formed on the surface 1c of the ceramic substrate 1 as shown in FIG. 12B by means of sputtering or the like. During this process, a protrusion 4c is formed on the via connecting pad 4a caused by dust or the like, and a defect 3b occurs in the via connecting pad 4b under the influence of the surface defect 3a (see FIG. 12A). In this state, a via 5a and a via 5b are formed so as to protrude upward on the respective surfaces of the via connecting pad 4a and the via connecting pad 4b, as shown in FIG. 12C.

In the next manufacturing process, a polyimide insulating layer 6 (see FIG. 12D) as an insulator is formed on the surface 1c of the ceramic substrate 1, and then the surface of the polyimide insulating layer 6 is polished as shown in FIG. 12D. At this time, the top section of the protrusion 4c is shaved and thus exposed, while a tapered defect 3d is formed due to a defect 3c (see FIG. 12C). Thus, the defective portion grows as follows: surface defect 3a →defect 3b→defect 3c→defect 3d as the manufacturing process proceeds along the steps of FIG. 12A to FIG. 12D.

In the next manufacturing process, patterns 7a to 7d are formed on the surface of the polyimide insulating layer 6 shown in FIG. 12E through the plating process, respectively. The pattern 7a and the via connecting pad 4a are short-circuited through the protrusion 4c, and in the same manner as explained above, the pattern 7c and the via connecting pad 4b are short-circuited through the protrusion 7e formed inside the defect 3d (see FIG. 12D). In the normal state, the pattern 7a has to be insulated from the via connecting pad 4a and the pattern 7c has to be insulated from the via connecting pad 4b as well. That is, the multilayer thin film wiring board shown in FIG. 12E is regarded as a defective.

By the way, the conventional multilayer thin film wiring board is manufactured through the manufacturing process steps as shown in FIG. 12B to FIG. 12E as explained above. However, during this process, a large number of defects may be generated because of the irregularities on the surface such as the surface defect 3a and the protrusion 4c. Accordingly, the manufacturing yield is reduced. This reduction of the yield may result in increase in cost of the multilayer thin film wiring board.

That is, the pattern 7a and the pattern 7b shown in FIG. 12E should originally be insulated from each other, but are short-circuited through the protrusion 4c, the via connecting pad 4a, and the via 5a. In the same manner as the above case, the pattern 7c and the pattern 7d should originally be insulated from each other, but are short-circuited through the protrusion 7e, the via connecting pad 4b, and the via 5b.

Recently, as the number of LSI terminals is increasing due to its higher density, the number of lines of wiring on the board that connects between LSIs is increasing, thus finer pitches of the wiring are demanded. This demand is stronger particularly for the thin film wiring board used in an MCM board, therefore, finer pitches of the wiring are progressing. The conventional method for manufacturing the thin film wiring board is shown in FIG. 13A to FIG. 13G.

At step 1, the ceramic substrate is sliced (around 0.1 mm to 0.3 mm), and holes are punched in the substrate (FIG. 13A). Each of the holes is then filled with tungsten (W) 81 to form a thin green sheet 80 as shown in the figure. aluminum ceramic, ceramic of aluminum nitride, or glass ceramic are used as a material of the ceramic substrate, and tungsten 81 or molybdenum or the like is used as metal for conduction to be filled in the holes. When the material of the ceramic substrate is glass ceramic, copper (Cu) is also usable as metal for conduction to be filled in the holes.

At step 2, a plurality of the green sheets 80 are laminated, pressurized, and sintered to form a sheet of base substrate 72 (see FIG. 13B and FIG. 13D). At this time, the tungsten 81 filled in the holes at step 1 becomes a via 73 which allows interlayer electric conduction.

At step 3, the surface of the base substrate 72 is mechanically polished to flatten the irregularities of the surface (see FIG. 13C and FIG. 13E).

At step 4, a chrome (Cr) layer or a titanium (Ti) layer as contact metal and a copper layer as a current-carrying layer at the time of plating are formed by a sputtering method. (Hereafter these layers are referred to as conductor layer as under plating. See FIG. 13F).

At step 5, a layer of copper 86 is formed in desired thickness on the conductor layer 85 as under plating formed at the previous step by electroplating. By the use of photolithography copper is formed only a required location (see FIG. 13G).

At step 6, a sputtered layer 85 within an area where the layer of copper 86 has not been formed is removed by etching. Any solution with which etching is selectably executed on each metal is used may be used as the enchant.

From then on, a thin film layer is formed on the base substrate 72 to finish a thin film wiring board by the ordinary manufacturing method for forming a thin film layer.

The most significant problem on the manufacturing method for the thin film wiring board is existence of a pin hole (hereafter referred to as Void) with its diameter of several pm occurring in tungsten 81 forming a via.

The void 84 occurs mainly at the time of filling the via with tungsten 81 in the step of forming the green sheet 80. More specifically, there are cases where the void occurs: during the operation of making tungsten 81 to a paste form, and due to being short of tungsten during the operation of filling the via with the paste. The void 84, that has once occurred, remains inside the tungsten 81 as it is.

In some of thousands of vias 73, the voids 84 are exposed to the surface of the base substrate 72 after the polishing process as shown in FIG. 13D, which causes pits to be formed on the surface of the base substrate 72 that should be flat.

As explained above, the pits (hereafter referred to as Void defect) on the surface of the base substrate 72, that have been formed by exposure of the voids 84 to the surface of the base substrate 72, inhibit wiring formation on the thin film layer 74 (thin film multilayer circuit section) formed on the base substrate 72 in the process as follows.

For example, when a polyimide layer as an interlayer insulating layer is to be formed in the process of forming the thin film layer 74, a polyimide compound is applied in a spin coating method. However, if a conductive pattern is not formed on the via 73, the polyimide compound is directly applied onto the via. In that case, the polyimide compound has not thoroughly entered as far as the internal side of some of the void defects, resultantly, the void defect has a space with air in it.

In the following sintering process, expansion of the air brings about such a phenomenon that the polyimide is rejected. As a result, the polyimide layer as an insulating layer for upper and lower patterns disappears, so that the layer to be laminated on that location is formed defectively, or the conductive pattern to be laminated on that location is short-circuited with the via 73 existing immediately below the pattern.

Further, when an etchant enters into the internal side of a void defect and is left inside in the process of forming the thin film layer, corrosion to tungsten due to the etchant, that has entered into the internal side of the void defect, is progressing with time as shown in an erosion portion 87 of FIG. 13G (although there is no functional defect at the time of manufacturing the thin film wiring board), and a malfunction may occur after some years.

As explained above, a board having a functional defect (or that will have a functional defect in future) such as an open circuit in a conductive pattern or a short circuit between conductive patterns, and a board, on which the predetermined number of layers can not be built up due to formation defect of the thin film layer, can not be used as a product, thus being disposed. As a result, the manufacturing yield does not increase, which causes the cost of manufacturing the thin film wiring board to become high.

These problems may occur in the same mechanism as explained above even when the base substrate 72 is a resin board.

However, it is difficult to perfectly eliminate the voids, and there has been no effective means invented so far about the technology of avoiding formation defect of a thin film layer due to void defects that have occurred. Because the thin film layer is high density and multilayer, it is actually impossible to correct defective points after the thin film layer is formed.

In order to solve the problems, a method, that formation defect of a thin film layer may be minimized by filling avoid defect with some material, has been considered. It is the method for filling a void defect with the same type of metal as that of the via.

However, the surface of the base substrate is directly exposed to the etchant at the time of forming a thin film layer, therefore, it is essential that the recess due to the void defect is completely filled without any space left so that the etchant will not remain within the void defect.

In contrast to this, when a void defect is filled in any known method such as a squeegee method, it is difficult to completely fill such small void defects each of around several μm without any void defect left and without any space left in each internal side. Further, the amount of the paste to be filled varies. Therefore, even if all the void defects are filled with the paste and the surface looks like a completely filled state, there may still be left some of the void defects in which the paste may be imperfectly filled in each internal side.

As a result, assuming that tungsten is used for correction, the surface of the corrected parts is directly exposed to the etchant at the time of etching. The tungsten has a property of being eroded by the etchant for chrome that is a conductor as under plating. Therefore, the surface portion is dissolved, and the etchant enters into the void defect portion imperfectly filled with the paste from the dissolved surface. Accordingly, the etchant is not completely removed and left inside the void defect portion even after the operation of removing the etchant from the void, which may derive inconvenience afterward.

SUMMARY OF THE INVENTION

It is an object of the present invention to provide a thin film wiring board that allows manufacturing yield to be improved and a method for manufacturing the thin film wiring board.

According to the present invention, the influence of the defect occurring in a first wiring layer is accommodated by forming a second wiring layer that has a function equivalent to the first wiring layer. When a defect exists in the first wiring layer, a defect occurs in a first insulating layer as a next layer to the first wiring layer. When the second wiring layer is formed, these defects are filled, therefore, the surface of the second wiring layer becomes flat. At this time, the first wiring layer and the second wiring layer are electrically connected to each other, so that the second wiring layer plays an electrical role the same as that of a wiring layer with no defect. Therefore, it is possible to prevent the influence of the defect upon a layer higher (the third wiring layer) than the second wiring layer, which allows yields to be improved.

Other objects and features of this invention will become apparent from the following description with reference to the accompanying drawings.

DESCRIPTION OF THE PREFERRED EMBODIMENTS

Four preferred embodiments of the multilayer thin film wiring board and the method for manufacturing the multilayer thin film wiring board according to this invention are explained in detail below with reference to the drawings.

Figure 12A:
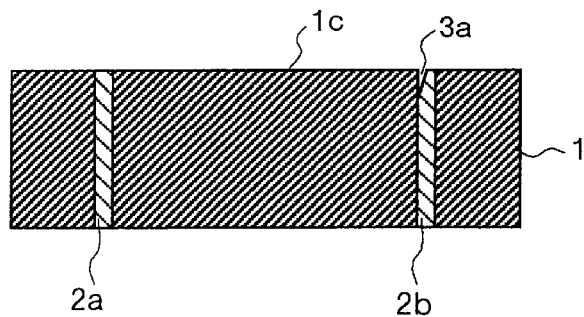
FIG. 12A to FIG. 12E show cross-sectional views of the configuration and the manufacturing process of the conventional thin film wiring board.
Figure 12B:
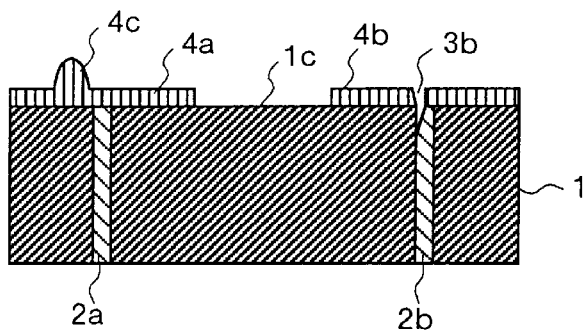
Figure 12C:
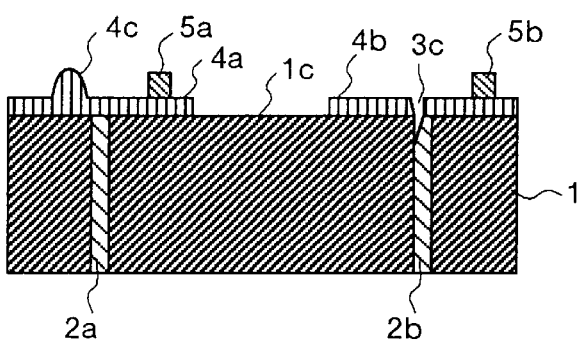
Figure 12D:
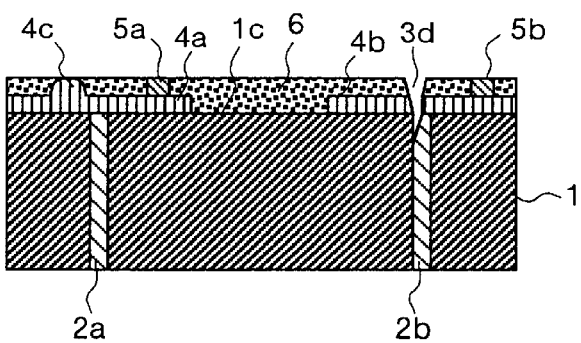
Figure 12E:
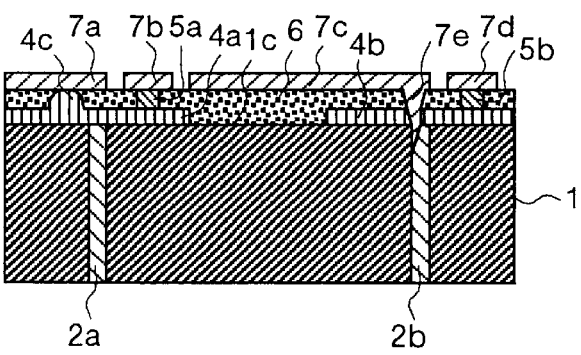
Figure 13A:
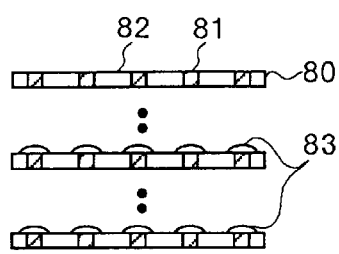
FIG. 13A to FIG. 13G show cross-sectional views of the manufacturing process of the conventional thin film wiring board.
Figure 13D:
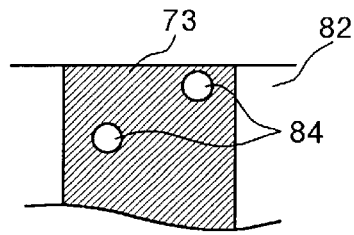
Figure 13B:
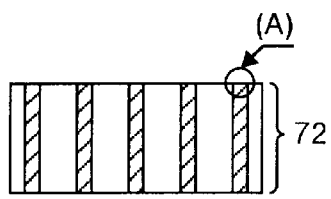
Figure 13E:
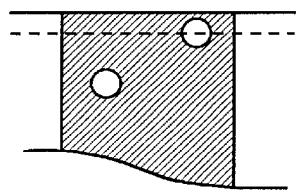
Figure 13C:
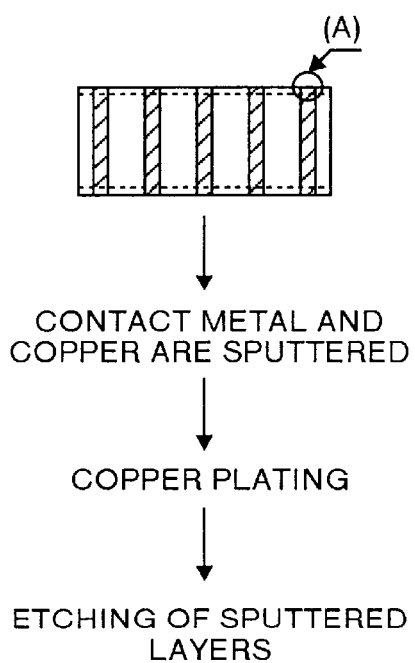
Figure 13F:
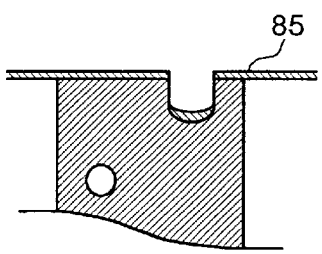
Figure 13G:
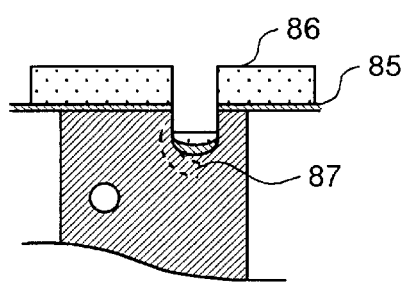

FIG. 1A to FIG. 1E and FIG. 2A and FIG. 2B show cross-sectional views of the configuration and the manufacturing process according to a first embodiment of this invention. The manufacturing process shown in FIG. 1B to FIG. 1D corresponds to the manufacturing process shown in FIG. 12B to FIG. 12D.

Figure 1A:
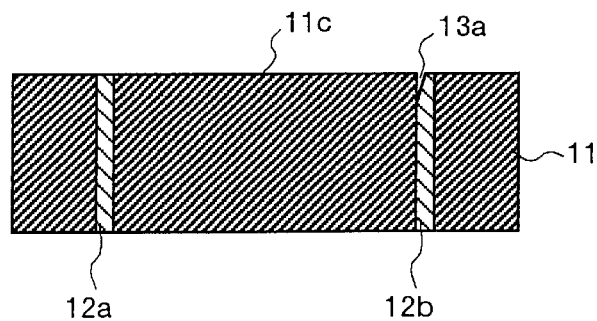
FIG. 1A to FIG. 1E show cross-sectional views of a configuration and a manufacturing process according to a first embodiment of this invention.

FIG. 1A shows a ceramic substrate 11 having a via 12a and a via 12b. This ceramic substrate 11 is obtained by sintering a laminated thin-film ceramic sheet, and the surface 11c of this ceramic substrate 11 is flattened. A surface defect 13a occurs due to the difference between the hardness of the ceramic substrate 11 and that of the via 12b. Further, the surface 11c of the ceramic substrate 11 is suppose to have irregularities due to a phenomenon that ceramic particles are detached or a phenomenon that a void occurring at the time of sintering the ceramic substrate 11 is exposed.

Figure 1B:
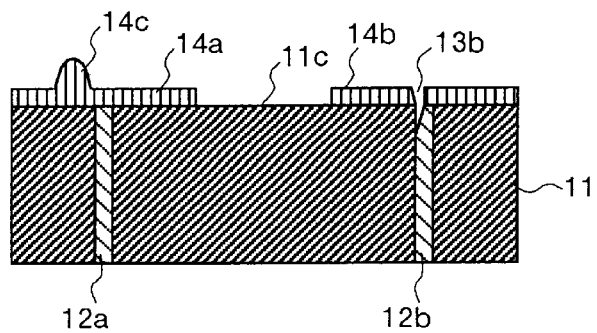
Figure 1C:
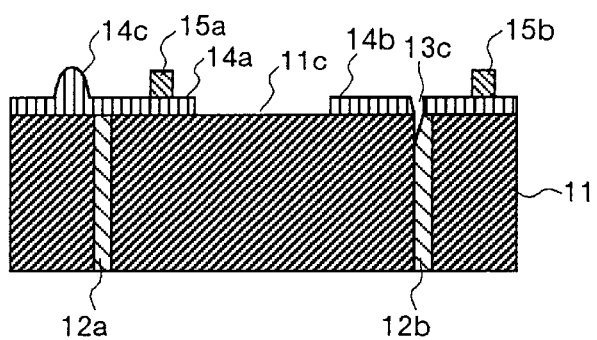

In the manufacturing process using the ceramic substrate 11 shown in FIG. 1A, a via connecting pad 14a and a via connecting pad 14b are formed on the surface 11c of the ceramic substrate 11 as shown in FIG. 1B by sputtering or the like. During this process, a protrusion 14c is formed on the via connecting pad 14a caused by dust or the like, and a defect 13b occurs in the via connecting pad 14b due to the surface defect 13a (see FIG. 1A). In this state, a via 15a and a via 15b are formed so as to protrude upward on the respective surfaces of the via connecting pad 14a and the via connecting pad 14b, as shown in FIG. 1C.

Figure 1D:
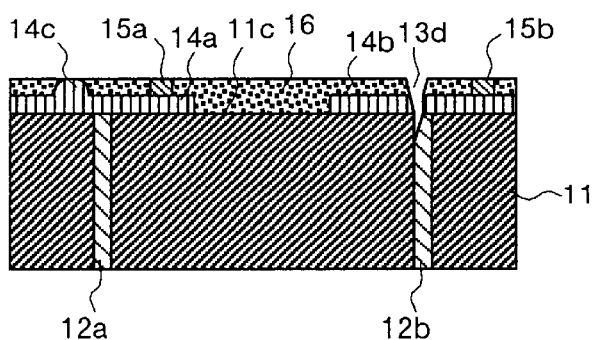

In the next manufacturing process, a polyimide insulating layer 16 (see FIG. 1D) as an insulation layer is formed on the surface 11c of the ceramic substrate 11. The surface of this polyimide insulating layer 16 is polished by a CMP method as shown in FIG. 1D. As a result, the surface of the polyimide insulating layer 16 is flattened. During this process, the top section of the protrusion 14c is shaved and thus exposed, while a tapered defect 13d is formed due to a defect 13c (see FIG. 1C). As explained above, the defective portion grows as follows: surface defect 13a→defect 13b→defect 13c→defect 13d as the manufacturing process proceeds along the steps of FIG. 1A to FIG. 1D.

Figure 1E:
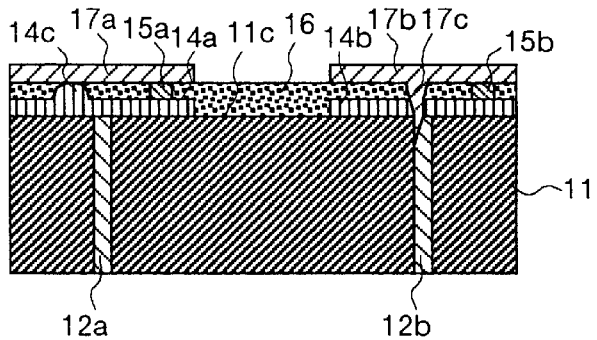

In the next manufacturing process, a dummy pad 17a with the same size (or almost the same size) as that of the via connecting pad 14a is formed on the surface of the polyimide insulating layer 16 shown in FIG. 1E through the plating process so as to be provided opposite to the via connecting pad 14a. The size of the dummy pad 17a is made to be the same (or almost the same size) as that of the via connecting pad 14a. That is because this size will accommodate misregistration that may occur when a via 18a explained later is formed and influence of the surface defect exerted over the wide area.

Further, the surface of the dummy pad 17a is flat. The dummy pad 17a is electrically connected to the via connecting pad 14a through the protrusion 14c, therefore, the dummy pad 17a and the via connecting pad 14a have the same potential. Accordingly, this dummy pad 17a plays an electrical role the same as the via connecting pad 14a Similarly, a dummy pad 17b with the same size as that of the via connecting pad 14b is formed on the surface of the polyimide insulating layer 16 through the plating process so as to be provided opposite to the via connecting pad 14b. At this time, the defect 13d (see FIG. 1D) is perfectly filled due to the effect of the plating process, therefore, a bad influence due to the defect 13d can be eliminated. The size of the dummy pad 17b is made to be the same (or almost the same size) as that of the via connecting pad 14b. That is because this size will accommodate misregistration that may occur when a via 18b explained later is formed and influence of the defect 13d (see FIG. 1D) exerted over the wide area. The surface of the dummy pad 17b is flat.

The dummy pad 17b is electrically connected to the via connecting pad 14b through a protrusion 17c, therefore, the dummy pad 17b and the via connecting pad 14b have the same potential. Accordingly, the dummy pad 17b plays an electrical role the same as the via connecting pad 14a.

Figure 2A:
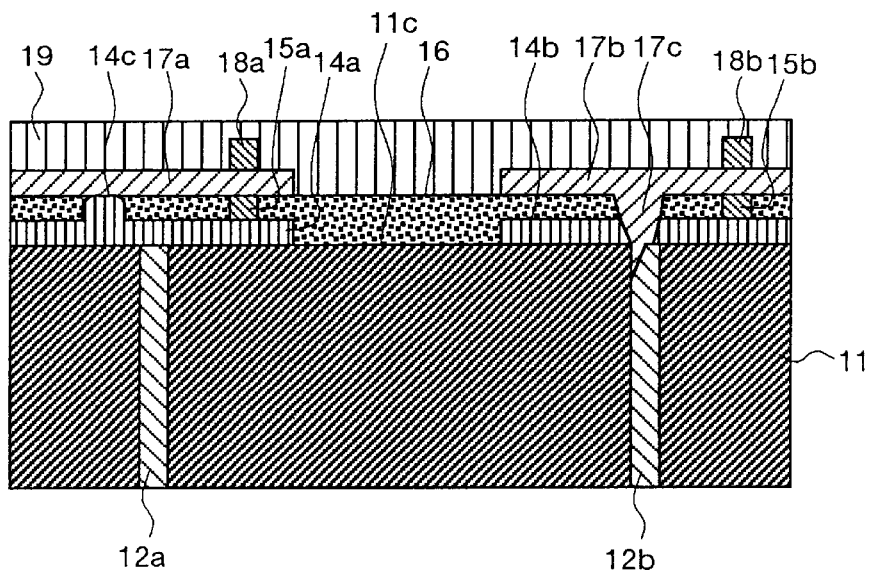
FIG. 2A and FIG. 2B show cross-sectional views of the configuration and the manufacturing process according to the first embodiment.

In the next manufacturing process, as shown in FIG. 2A, the via 18a and the via 18b are formed on the surface of the dummy pad 17a and the dummy pad 17b through the plating process so as to be provided opposite to the via 15a and the via 15b. In this state, a polyimide insulating layer 19 as an insulator is formed so as to cover the polyimide insulating layer 16, the dummy pad 17a, the dummy pad 17b, the via 18a, and the via 18b.

Figure 2B:
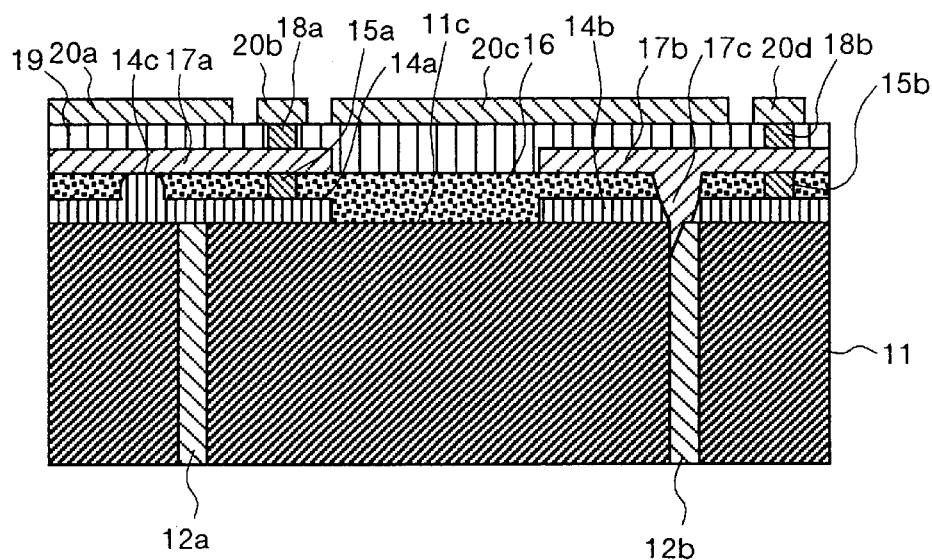

As shown in FIG. 2B, the surface of the polyimide insulating layer 19 is polished by applying the CMP method. Accordingly, the surface of the polyimide insulating layer 19 is perfectly flattened. It should be noted here that a defect is hard to occur on the surface of the polyimide insulating layer 19 because the defect 13d (see FIG. 1D) is completely buried when the dummy pad 17b is formed. In the next manufacturing process, patterns 20a to 20d are formed through the plating process, respectively. At this time, each of the patterns 20a to 20d is insulated from the others. Therefore, the multilayer thin film wiring board shown in FIG. 2B is an accepted product.

As explained above, according to the first embodiment, the influence of the defect 13d is accommodated by forming the dummy pads 17a and 17b. Therefore, it is possible to prevent the influence of the defect upon a layer above the dummy pads 17a and 17b, which allows yield to be improved.

In the first embodiment, although the case where a via (e.g., via 15b) is formed between the pair of layers (e.g., the via connecting pad 14b and the dummy pad 17b) as shown in FIG. 2B is explained, a plurality of vias may be formed between the pair of layers. The reason for forming the plurality of vias is because electrical defect is avoided. This electrical defect occurs due to a via distorted by being formed immediately above a surface defect. This case is explained below as a second embodiment.

Figure 3A:
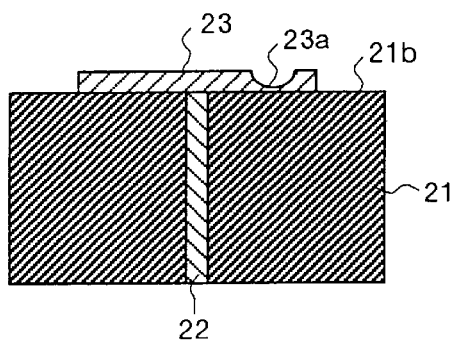
FIG. 3A to FIG. 3F show cross-sectional views of a configuration and a manufacturing process according to a second embodiment of this invention.
Figure 3B:
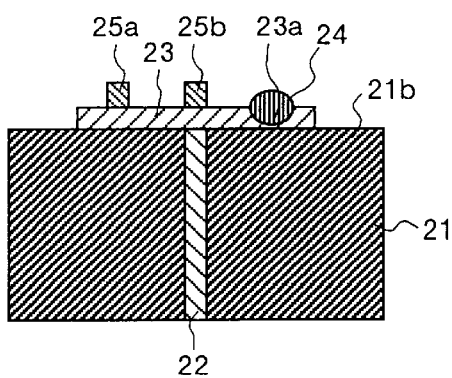

FIG. 3A to FIG. 3F show cross-sectional views of a configuration and a manufacturing process according to the second embodiment of this invention. FIG. 3A shows a ceramic substrate 21 having a via 22. This ceramic substrate 21 is obtained by sintering a laminated thin-film ceramic sheet, and the surface 21b of this ceramic substrate 21 is flattened. This surface 21b is supposed to have irregularities caused by the same process as that of the surface 11c of the ceramic substrate 11 as shown in FIG. 1A.

In the manufacturing process using the ceramic substrate 21 as shown in FIG. 3A, a via connecting pad 23 is formed on the surface 21b of the ceramic substrate 21 through the plating process. At this time, a recessed surface defect 23a is assumed to occur on the surface of the via connecting pad 23. Three vias: a via 24, a via 25a, and a via 25b are formed in parallel with each other so as to protrude upward on the surface of the via connecting pad 23 shown in FIG. 3B. The form of the via 24 is assumed to be distorted because it is formed immediately above the surface defect 23a. Accordingly, the via 24 does not function as an ordinary via. In contrast, the via 25a and the via 25b have a normal shape because these two are formed on the surface where no surface defect exists. Therefore, the via 25a and the via 25b function normally as a via.

Figure 3C:
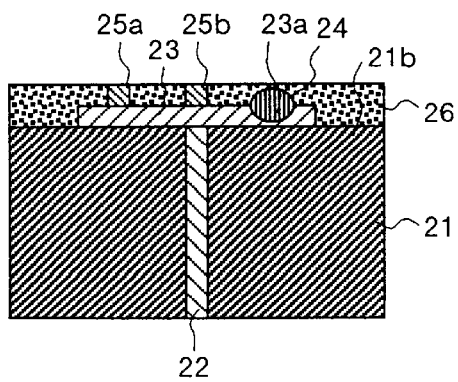

In the next manufacturing process, a polyimide insulating layer 26 (see FIG. 3C) as an insulator is formed so as to cover the surface 21b of the ceramic substrate 21 the via connecting pad 23, the via 24, the via 25a, and the via 25b. As shown in FIG. 3C, the surface of the polyimide insulating layer 26 is then polished by the CMP method. As a result, the surface of the polyimide insulating layer 26 is flattened, which causes the via 25a and the via 25b to be exposed. On the other hand, the via 24 is fully buried in the polyimide insulating layer 26 even after the polishing, so that it does not function as an ordinary via.

Figure 3D:
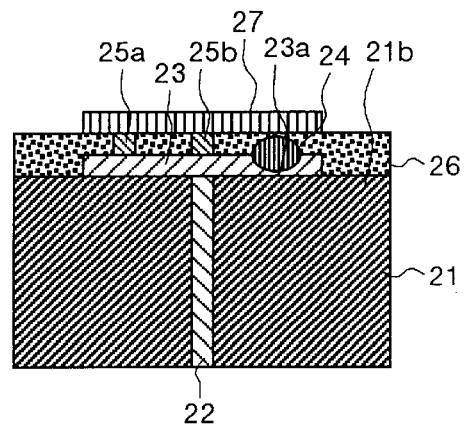

In the next manufacturing process, a dummy pad 27 with the same size (or almost the same size) as that of the via connecting pad 23 is formed on the surface of the polyimide insulating layer 26 shown in FIG. 3D through the plating process so as to be provided opposite to the via connecting pad 23. The size of the dummy pad 27 is made to be the same (or almost the same size) as that of the via connecting pad 23. That is because the dummy pad 27 is electrically connected to at least one of the via 24, the via 25a, and the via 25b without fail.

In this case, the dummy pad 27 is electrically connected to two vias such as the via 25a and the via 25b. Accordingly, the dummy pad 27 plays an electrical role the same as the via connecting pad 23 because this pad 27 is electrically connected to the via connecting pad 23 through the via 25a and the via 25b.

Figure 3E:
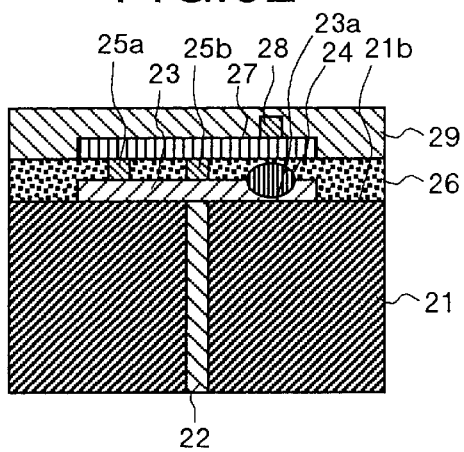

In the next manufacturing process, a via 28 is formed on the surface of the dummy pad 27 through the plating process as shown in FIG. 3E. In this state, a polyimide insulating layer 29 as an insulator is formed so as to cover the polyimide insulating layer 26, the dummy pad 27, and the via 28.

Figure 3F:
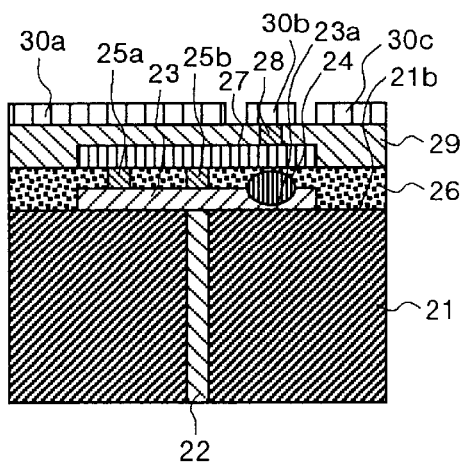

As shown in FIG. 3F, the surface of the polyimide insulating layer 29 is polished by the CMP method. In the next manufacturing process, patterns 30a to 30c are formed through the plating process. At this time, each of the patterns 30a to 30c is insulated from the others.

As explained above, according to the second embodiment, the surface of the substrate is configured with redundancy by forming a plurality of vias 24, 25a, and 25b. Therefore, even if the via 24 is distorted because of its formation immediately above the surface defect 23a, an electrical operation is insured by the other vias 25a and 25b which are redundantly configured, thus, the yields can further be improved.

Although the case where the multilayer thin film structure is formed on the surface 11c of the ceramic substrate 11 as shown in FIG. 2B is explained in the first embodiment, the invention is not limited by this embodiment. Therefore, a multilayer thin film structure may be formed on both of the top surface and the underside of the ceramic substrate. This case will be explained below as a third embodiment.

Figure 4A:
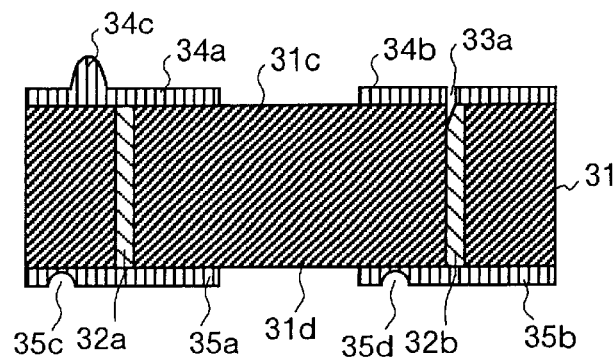
FIG. 4A to FIG. 4D show cross-sectional views of a configuration and a manufacturing process according to a third embodiment of this invention.

FIG. 4A to FIG. 4D and FIG. 5A to FIG. 5D show cross-sectional views of a configuration and a manufacturing process steps according to the third embodiment of this invention. FIG. 4A shows a ceramic substrate 31 having a vias 32a and 32b. This ceramic substrate 31 is obtained by sintering a laminated thin-film ceramic sheet, and the top surface 31c (underside 31d) of this ceramic substrate 31 is flattened. A surface defect 33a occurs under the influence of the difference between the hardness of the ceramic substrate 31 and that of the via 32b. Further, the top surface 31c (underside 31d) of the ceramic substrate 1 is supposed to have irregularities due to a phenomenon that ceramic particles are detached or a phenomenon that a void occurring at the time of sintering the ceramic substrate 31 is exposed.

In the manufacturing process using the ceramic substrate 31 shown in FIG. 4A, a via connecting pad 34a and a via connecting pad 34b are formed on the top surface 31c of the ceramic substrate 31 through the plating process. During this process, a protrusion 34c is formed on the via connecting pad 34a caused by dust or the like, and a defect 33b (see FIG. 4B) occurs in the via connecting pad 34b due to the surface defect 33a.

Figure 4B:
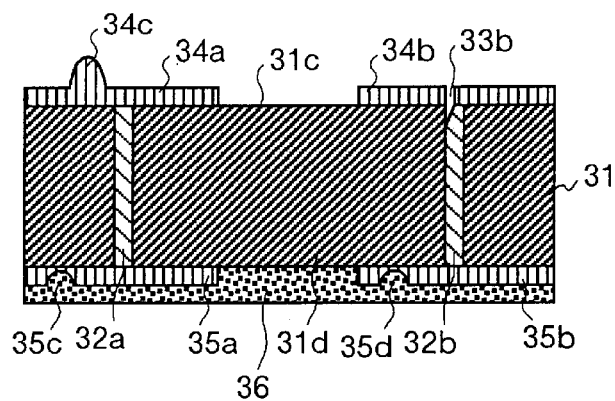

In the next manufacturing process, a via connecting pad 35a and a via connecting pad 35b are formed on the underside 31d of the ceramic substrate 31 through the plating process. During this process, recessed defects 35c and 35d are assumed to occur in the via connecting pad 35a and the via connecting pad 35b. In this state, as shown in FIG. 4B, a protection film 36, that is highly resistant to chemical attack, is formed so as to cover the underside 31d of the ceramic substrate 31, the via connecting pad 35a, and the via connecting pad 35b.

Figure 4C:
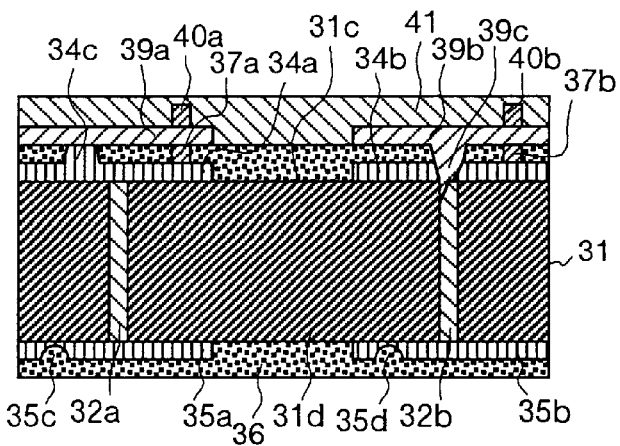
Figure 4D:
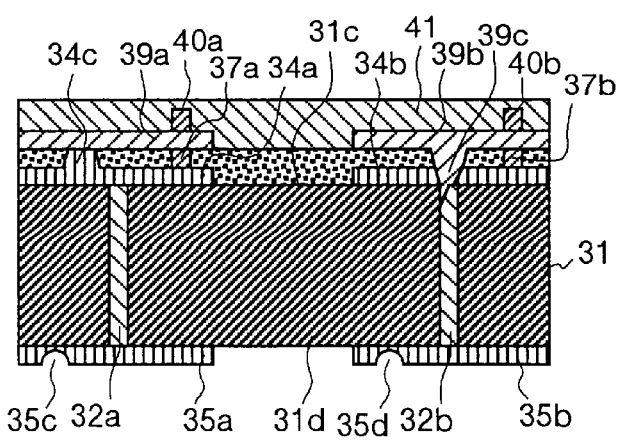

From then on, as shown in FIG. 4C, each of a via 37a, a via 37b, a polyimide insulating layer 38, a dummy pad 39a, a dummy pad 39b, a via 40a, a via 40b, and a polyimide insulating layer 41 is formed through the manufacturing process steps that have been explained with reference to FIG. 1C to FIG. 1E and FIG. 2A. The defect 33b (see FIG. 4B) is completely filled with a protrusion 39c. In the next manufacturing process, the protection film 36 (see FIG. 4C) is removed as shown in FIG. 4D.

Figure 5A:
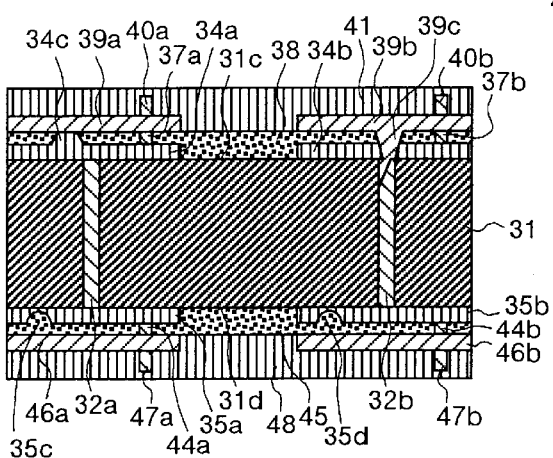
FIG. 5A to FIG. 5D show cross-sectional views of the configuration and the manufacturing process according to the third embodiment.

Further, as shown in FIG. 5A, each of a via 44a, a via 44b, a polyimide insulating layer 45, a dummy pad 46a, a dummypad 46b, avia 47a, avia 47b, and a polyimide insulating layer 48 is formed on the underside 31d of the substrate through the manufacturing process steps that have been explained with reference to FIG. 1C to FIG. 1E and FIG. 2A.

Figure 5B:
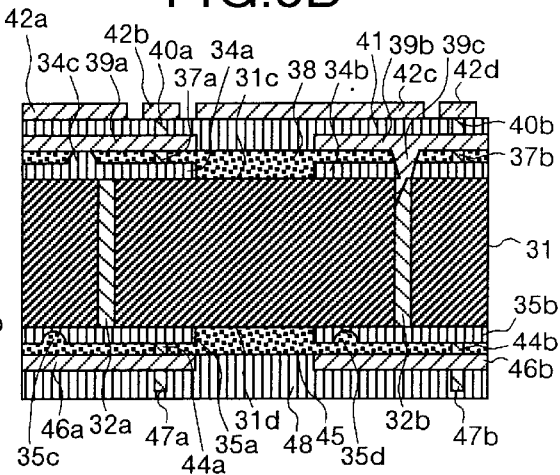

In the next manufacturing process, the surface of the polyimide insulating layer 41 is polished as shown in FIG. 5B. Accordingly, the surface of the polyimide insulating layer 41 is perfectly flattened. It should be noted here that any defect is hard to occur on the surface of the polyimide insulating layer 41 because the defect 33b (see FIG. 4B) is completely filled with the protrusion 39c when the dummy pad 39b is formed.

Figure 5C:
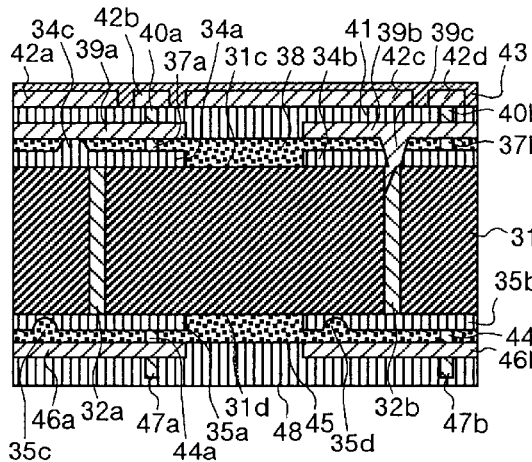

In the next manufacturing process, patterns 42a to 42d are formed through the plating process, respectively. at this time, each of the patterns 42a to 42d is insulated from the others. In this state, a protection film 43 is formed to protect the polyimide insulating layer 41 and the patterns 42a to 42d as shown in FIG. 5C.

Figure 5D:
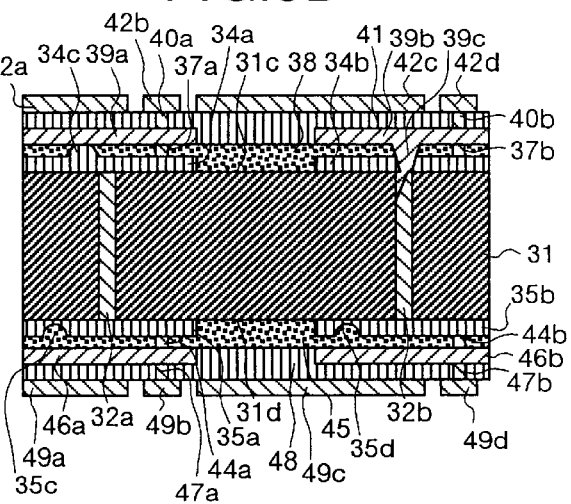

In the next manufacturing process, the surface of the underside 31d of the polyimide insulating layer 48 is polished as shown in FIG. 5D. Accordingly, the surface of the polyimide insulating layer 48 is perfectly flattened. In the next manufacturing process, patterns 49a to 49d are formed through the plating process, respectively. At this time, each of the patterns 49a to 49d is insulated from the others. The protection film 43 is removed in the final manufacturing process.

As explained above, according to the third embodiment, a structure is formed on both of the top surface and the underside of the ceramic substrate 31. Therefore, the yields can be improved, and at the same time, a higher density board can be obtained.

Although the first to third embodiments of the invention have been explained in detail with respect to the drawings, the specific examples of the configurations are not limited by these embodiments but may be embodied in modified forms without departing from the spirit of the invention. For example, in the third embodiment, the example where the multilayer thin film structure is formed on both of the top surface and the underside of the ceramic substrate 31 has been explained. However, a combination of the multilayer thin film structure explained in the first embodiment with the multilayer thin film structure explained in the second embodiment may be formed on the top surface and the underside of the substrate.

As explained above, according to this invention, the influence of the defect occurring in the first wiring layer is accommodated by forming the second wiring layer that has the function equivalent to the first wiring layer. Therefore, it is possible to prevent the influence of the defect upon a layer (the third wiring layer) higher than the second wiring layer, which allows yields to be improved.

According to this invention, the influence of the defect occurring in the first wiring layer is accommodated by forming the second wiring layer that has the function equivalent to the first wiring layer the nearest to the base substrate. Therefore, it is possible to prevent the influence of the defect upon a layer (the third wiring layer) higher than the second wiring layer, which allows yields to be improved.

According to this invention, the surface of the first insulating layer or the second insulating layer is flattened by polishing. Therefore, the influence of the defect is thoroughly eliminated, so that it is possible to perfectly prevent the influence of the defect on a layer higher (the third wiring layer) than the second wiring layer, which allows yields to significantly be improved.

FIG. 6, FIG. 7A to FIG. 7C, FIG. 8A to FIG. 8F, and FIG. 9A to FIG. 9E show a fourth embodiment of this invention. A base substrate 50 is manufactured in the method as shown in FIG. 7A to FIG. 7C.

Figure 7A:
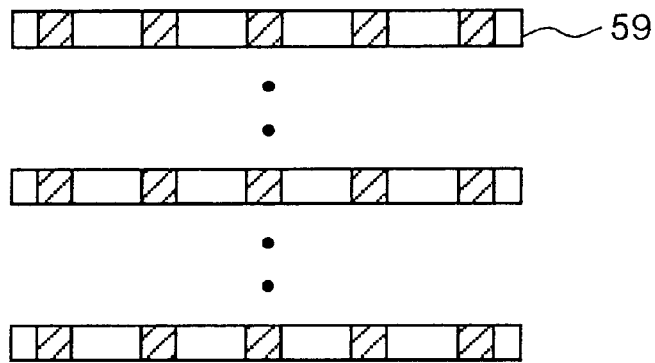
FIG. 7A to FIG. 7C show a manufacturing process of a base substrate in the fourth embodiment of this invention.
Figure 7B:
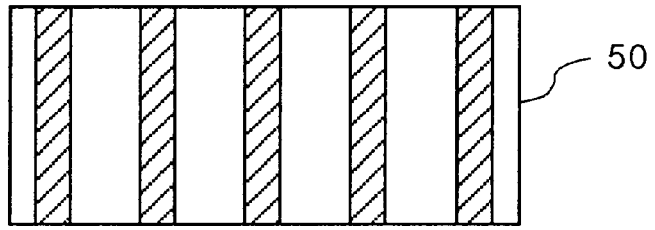
Figure 7C:
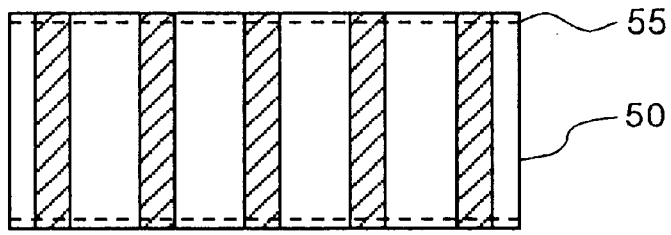

As shown in the figures, the base substrate 50 is finished, in the same manner as the conventional method, by pressuring a plurality of thin green sheets 59, sintering and laminating them, and then polishing the base surface as far as a sliced face 55 (see FIG. 7A to FIG. 7C).

Figure 6:
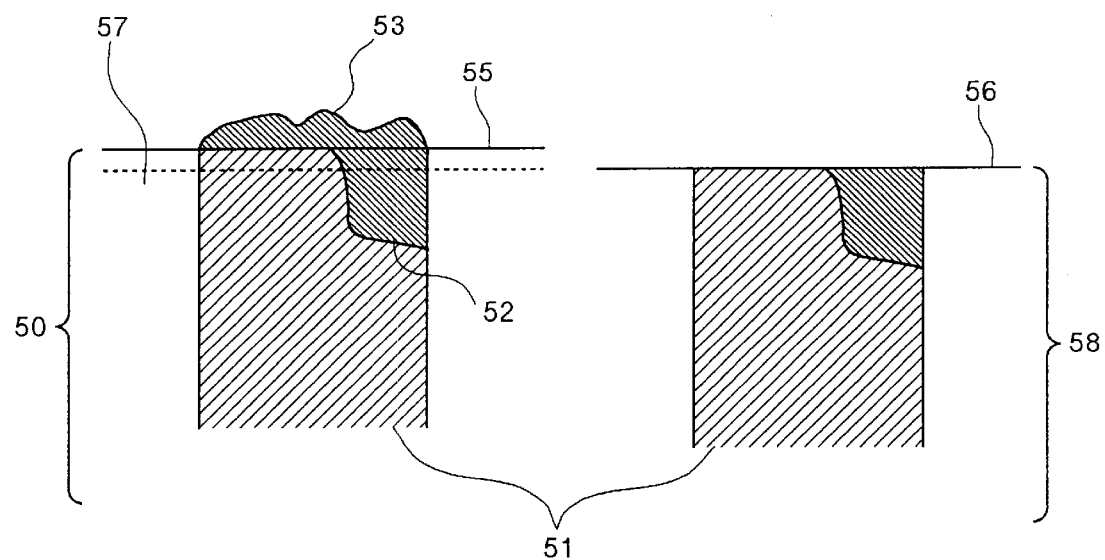
FIG. 6 shows a correcting process of a void defect in a fourth embodiment of this invention.

After the base substrate 50 is finished, a void defect occurring in a via 51 of the base substrate 50 is corrected by the method as shown in FIG. 6. Nickel 53 is deposited through electroless plating on the base substrate 50 before the void defect is corrected. As shown in FIG. 6, nickel 53 is deposited over the entire surface of tungsten 81 where a through hole via 51 is formed except the ceramic section 57 (step 1).

The surface of the base substrate 50 on which nickel 53 has been deposited is polished, and the irregularities on the surface of the board occurring due to the plating at step 1 (see FIG. 7A) are flattened to form a cur face 56. At this time, after the polishing reaches the sliced face 55, further polishing is suppressed to around several $\mu$m at maximum so that another void, not shown, hidden inside the via will not be exposed to the surface of the board (step 2). The flattening is performed by double-sided polishing, that is, polishing executed on the base substrate 50 simultaneously from both sides of the substrate.

FIG. 8A to FIG. 8F and FIG. 9A to FIG. 9E sequentially show manufacturing process steps of the thin film multilayer circuit. A conductor 60 as under plating of chrome and copper is formed as contact metal (see FIG. 8A) on the base substrate 58 whose void defect has been corrected through step 1 (see FIG. 7A) and step 2 (see FIG. 7B) by the sputtering method.

Figure 8A:
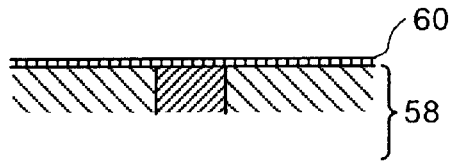
FIG. 8A to FIG. 8F show a manufacturing process of a thin film multilayer circuit in the fourth embodiment of this invention.
Figure 8B:
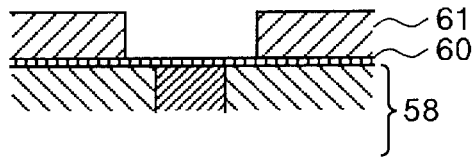
Figure 8C:
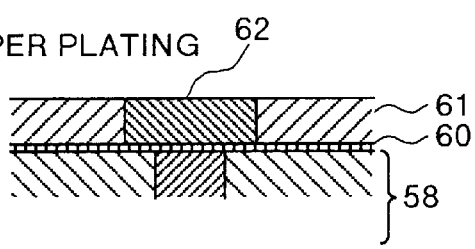
Figure 8D:
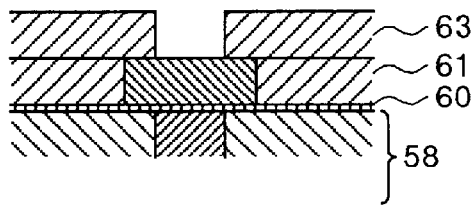
Figure 8E:
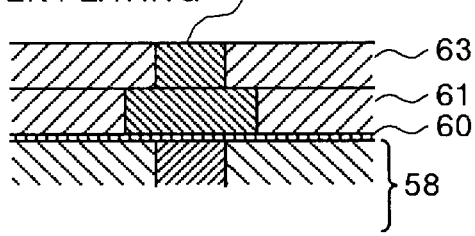
Figure 8F:
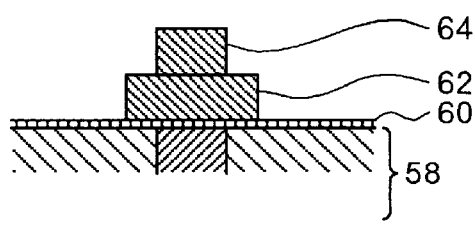

A resist material is applied over the whole conductor 60 to be plated, unnecessary portion is removed by the use of photolithography, and a resist 61 is formed over a predetermined area except an area where a pattern conductor is formed (see FIG. 8B). A pattern 62 of copper is formed on the conductor 60 as under plating through electroplating (see FIG. 8C). Further, a resist material is applied over the whole surface of the resist and pattern, an unnecessary portion is then removed by the use of photolithography, and a resist 63 is formed over a predetermined area except an area where a via section that electrically conducts between the upper and the lower layers is formed (see FIG. 8D). A copper layer 64 is formed through electroplating (see FIG. 8E). The resist 61 and the resist 63 are peeled (see FIG. 8F).

Any unnecessary portions are removed out of the conductor 60 as under plating that consists of the chrome layer and the copper layer by etching. At this time, an alkaline solution with which copper is not dissolved but only chrome is soluble is used for etching for the chrome layer (see FIG. 9A). A polyimide 65 as an insulator is coated by the spin coating method or the like (see FIG. 9B).

Figure 9A:
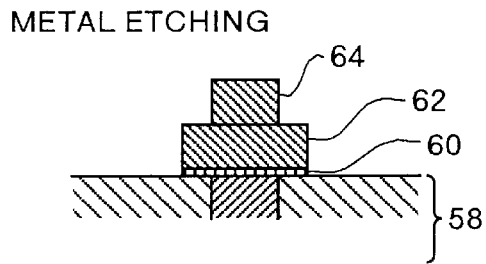
FIG. 9A to FIG. 9E show the manufacturing process of the thin film multilayer circuit in the fourth embodiment of this invention.
Figure 9B:
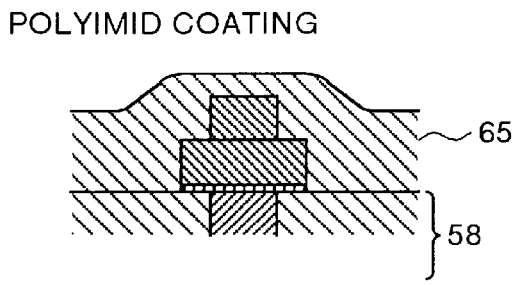
Figure 9C:
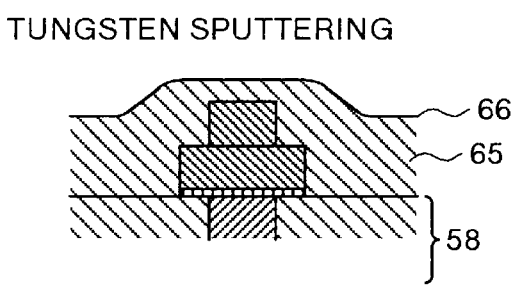
Figure 9D:
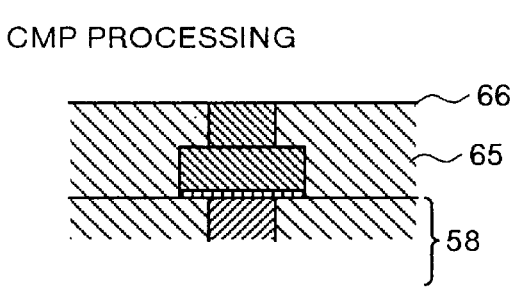
Figure 9E:
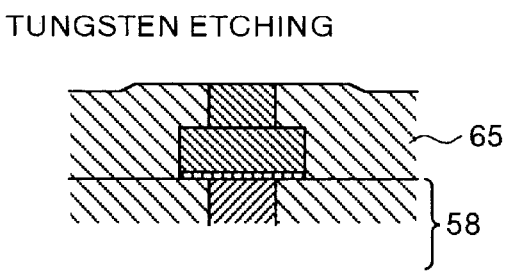
Figure 10:
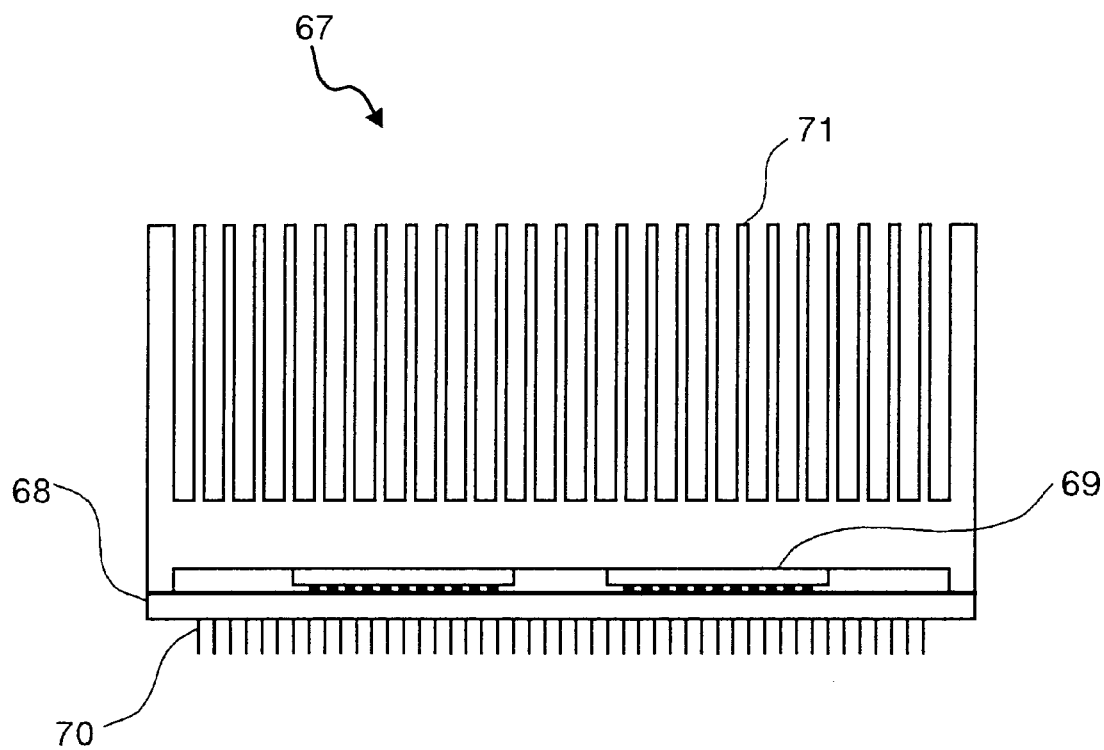
FIG. 10 shows a side view of MCM.
Figure 11:
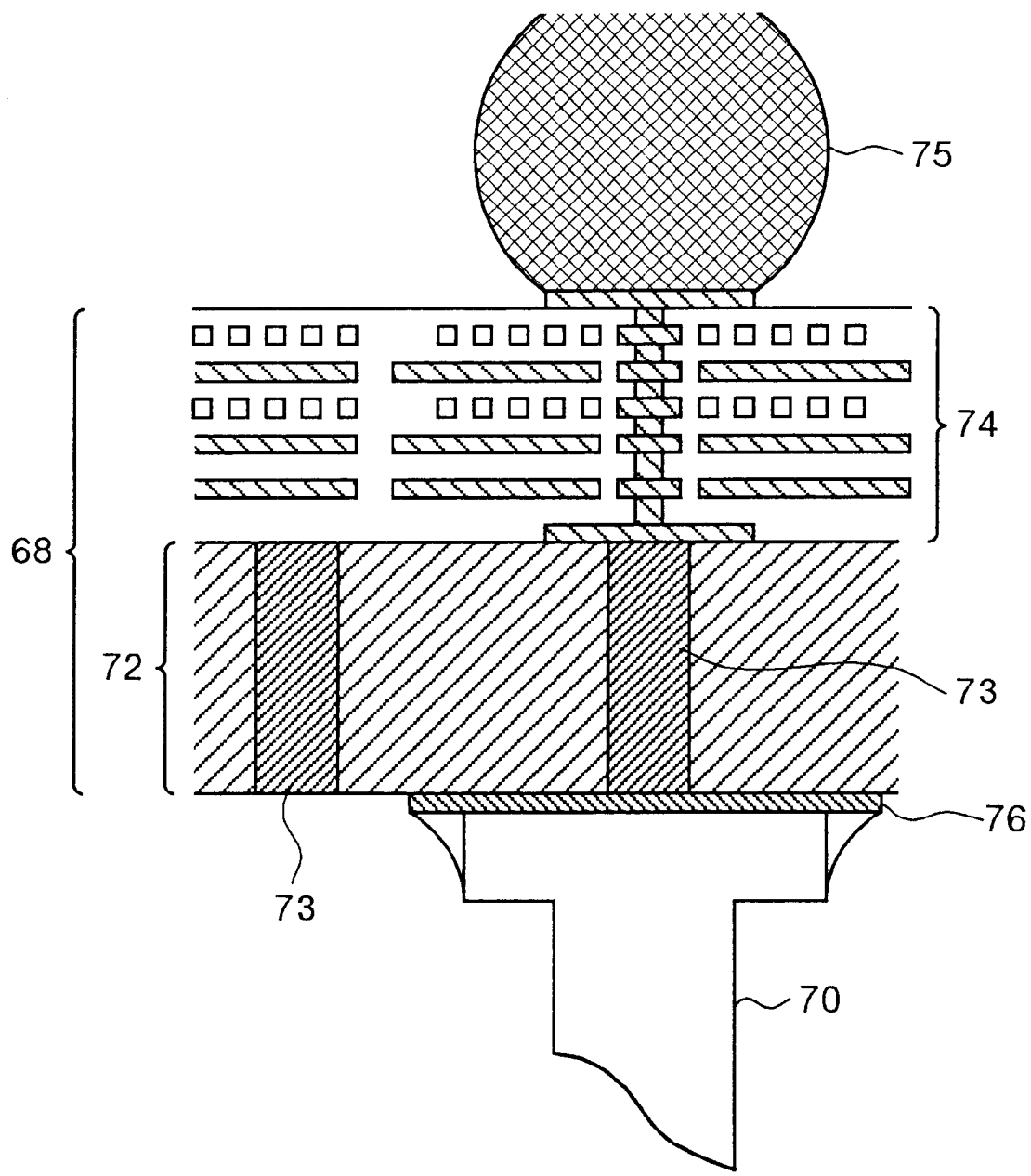
FIG. 11 shows an enlarged cross-sectional view of a thin film wiring board in the MCM.

Tungsten 66 used to determine a location to be polished is formed by the sputtering method on the polyimide 65 coated at the previous step (see FIG. 9C). The protruding section of the polyimide 65 is flattened by the processing of chemical mechanical polishing (hereafter referred to as CMP processing) (see FIG. 9D). After the CMP processing, the remaining tungsten 66 is removed by etching (see FIG. 9E).

From then on, the steps in FIG. 8A to FIG. 8F and FIG. 9A to FIG. 9E are repeated if necessary to laminate films. According to the steps, a thin film multilayer circuit is formed on the base substrate to finish a thin film wiring board.

As explained above, the present invention relates to a method for manufacturing a thin film wiring board, in which a void defect occurring in a via of the base substrate is corrected with a conductive material having corrosion resistance to an etchant. Accordingly, any inhibiting factor against formation of a thin film layer is eliminated, and as a result, the manufacturing yield can be improved, which allows cost reduction to be realized.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A multilayer thin film wiring board comprising:
   a first wiring layer on which a first wiring pattern is formed;
   a first insulating layer which covers said first wiring layer;
   a second wiring layer formed on said first insulating layer, electrically connected to said first wiring layer, and on which a second wiring pattern being the same pattern as said first wiring pattern is formed;
   a second insulating layer which covers said second wiring layer; and
   a third wiring layer formed on said second insulating layer and which has a third wiring pattern electrically connected to said second wiring layer.

2. The multilayer thin film wiring board according to claim 1, wherein said second wiring layer is formed through a plating process.

3. The multilayer thin film wiring board according to claim 1, wherein said first wiring layer and said second wiring layer are laminated with respect to a base substrate, and said first wiring layer is formed on the surface of the base substrate.

4. The multilayer thin film wiring board according to claim 3, wherein said second wiring layer is formed through a plating process.

5. The multilayer thin film wiring board according to claim 1, wherein said first wiring layer and said second wiring layer are electrically connected to each other with a plurality of vias.

6. The multilayer thin film wiring board according to claim 3, wherein said first wiring layer and said second wiring layer are electrically connected to each other with a plurality of vias.

7. The multilayer thin film wiring board according to claim 3, wherein a structure, in which said first wiring layer, said second wiring layer, and an insulating layer that insulates these layers are laminated, is formed on both of the top surface and the underside of said base substrate.

8. A method for manufacturing a multilayer thin film wiring board comprising the steps of:
   forming a first wiring layer on which a first wiring pattern is formed;
   forming a first insulating layer which covers said first wiring layer;
   forming a second wiring layer on said first insulating layer, electrically connected to said first wiring layer, and on which a second wiring pattern being the same pattern as said first wiring pattern is formed;
   forming a second insulating layer which covers said second wiring layer; and
   forming a third wiring layer on said second insulating layer and which has a third wiring pattern electrically connected to said second wiring layer.

9. The method for manufacturing the multilayer thin film wiring board according to claim 8, wherein said second wiring layer is formed through a plating process.

10. The method for manufacturing the multilayer thin film wiring board according to claim 8, wherein said first wiring layer is formed by the step of being laminated on the surface of a base substrate.

11. The method for manufacturing the multilayer thin film wiring board according to claim 10, wherein said second wiring layer is formed through a plating process.

12. The method for manufacturing the multilayer thin film wiring board according to claim 8, wherein the surface of the formed insulating layer is flattened by polishing in any one or both the steps of forming the first insulating layer and the second insulating layer.

13. A method for manufacturing a multilayer thin film wiring board comprising the steps of:
   forming a first wiring layer, on which a first wiring pattern is formed, on the top surface of a base substrate;
   forming a first insulating layer which covers said first wiring layer;
   forming a second wiring layer on said first insulating layer, electrically connected to said first wiring layer, and on which a second wiring pattern being the same pattern as said first wiring pattern is formed;
   forming a second insulating layer which covers said second wiring layer;
   forming a third wiring layer on said second insulating layer and which has a third wiring pattern electrically connected to said second wiring layer,
   forming a fourth wiring layer, on which a fourth wiring pattern is formed, on the underside of the base substrate;
   forming a fourth insulating layer which covers said fourth wiring layer;
   forming a fifth wiring layer on said fourth insulating layer, electrically connected to said fourth wiring layer, and on which a fifth wiring pattern being the same pattern as said fourth wiring pattern is formed;

forming a fifth insulating layer which covers said fifth wiring layer; and forming a sixth wiring layer on said fifth insulating layer and which has a sixth wiring pattern electrically connected to said fifth wiring layer.

14. The method for manufacturing the multilayer thin film wiring board according to claim 13, wherein the surface of said insulating layer is flattened by polishing in any one or both the steps of forming the first insulating layer, the second insulating layer, the fourth insulating layer, and the fifth insulating layer.

15. A base substrate comprising:

a base substrate having a via which allows interlayer electric conduction; and a conductive material formed in a void defect existing in said via and which has corrosion resistance against an etchant.

16. The base substrate according to claim 15, wherein said conductive material formed in said void defect is nickel which is deposited through electroless plating.

17. The base substrate according to claim 15, wherein said conductive material formed in said void defect is obtained by flattening the surface of nickel, that has been deposited through electroless plating, by polishing.

18. A method for manufacturing a thin film wiring board with a thin film layer formed on a base substrate having a via which allows interlayer electric conduction, the method comprising the steps of:

filling a void defect existing in said via with a conductive material having corrosion resistance against an etchant, and forming a thin film layer on said base substrate.

19. A thin film wiring board comprising:

a base substrate having a via which allows interlayer electric conduction;

a conductive material formed in a void defect existing in said via and which has corrosion resistance against an etchant; and a thin film layer formed on said base substrate on which said conductive material is formed.

20. A method for manufacturing a base substrate having a via which allows interlayer electric conduction, the method comprising the step of:

filling a void defect existing in said via with a conductive material having corrosion resistance against an etchant.

* * * * *